(12) United States Patent
Anderson et al.

(10) Patent No.: US 11,823,998 B2
(45) Date of Patent: Nov. 21, 2023

(54) TOP VIA WITH NEXT LEVEL LINE SELECTIVE GROWTH

(71) Applicant: International Business Machines Corporation, Armonk, NY (US)

(72) Inventors: Brent Anderson, Jericho, VT (US); Lawrence A. Clevenger, Saratoga Springs, NY (US); Christopher J. Penny, Saratoga Springs, NY (US); Nicholas Anthony Lanzillo, Wynantskill, NY (US); Kisik Choi, Watervliet, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 17/475,702

(22) Filed: Sep. 15, 2021

(65) Prior Publication Data
US 2022/0005761 A1    Jan. 6, 2022

Related U.S. Application Data

(62) Division of application No. 16/840,727, filed on Apr. 6, 2020, now Pat. No. 11,171,084.

(51) Int. Cl.
*H01L 23/522* (2006.01)
*H01L 21/768* (2006.01)

(52) U.S. Cl.
CPC .... *H01L 23/5226* (2013.01); *H01L 21/76802* (2013.01); *H01L 21/76871* (2013.01); *H01L 21/76877* (2013.01)

(58) Field of Classification Search
CPC .......... H01L 23/5226; H01L 21/76871; H01L 21/76877; H01L 21/76802
See application file for complete search history.

(56) References Cited

U.S. PATENT DOCUMENTS

| | | | |
|---|---|---|---|
| 5,512,514 A | 4/1996 | Lee | |
| 5,674,787 A | 10/1997 | Zhao et al. | |
| 5,693,568 A | 12/1997 | Liu et al. | |
| 6,211,085 B1 | 4/2001 | Liu | |
| 6,893,957 B2 | 5/2005 | Trivedi et al. | |

(Continued)

OTHER PUBLICATIONS

Anderson et al., "Top Via with Next Level Line Selective Growth," U.S. Appl. No. 16/840,727, filed Apr. 6, 2020.

(Continued)

*Primary Examiner* — Karen Kusumakar
(74) *Attorney, Agent, or Firm* — CANTOR COLBURN LLP; Daniel Yeates

(57) ABSTRACT

Embodiments of the present invention are directed to fabrication methods and resulting interconnect structures having a conductive thin metal layer on a top via that promotes the selective growth of the next level interconnect lines (the line above). In a non-limiting embodiment of the invention, a first conductive line is formed in a dielectric layer. A via is formed on the first conductive line and a seed layer is formed on the via and the dielectric layer. A surface of the seed layer is exposed and a second conductive line is deposited onto the exposed surface of the seed layer. In a non-limiting embodiment of the invention, the second conductive line is selectively grown from the seed layer.

9 Claims, 16 Drawing Sheets

(56) References Cited

U.S. PATENT DOCUMENTS

| | | | |
|---|---|---|---|
| 7,049,702 B2 | 5/2006 | Tseng | |
| 9,190,323 B2 | 11/2015 | Zhang et al. | |
| 9,601,371 B2 | 3/2017 | Edelstein et al. | |
| 9,613,861 B2 | 4/2017 | Anderson et al. | |
| 10,177,028 B1 | 1/2019 | Licausi et al. | |
| 2007/0284736 A1* | 12/2007 | Yang | H01L 21/76844 |
| | | | 257/E21.585 |
| 2020/0126923 A1* | 4/2020 | Hu | H01L 23/5383 |
| 2020/0219794 A1* | 7/2020 | Komatsu | H01L 23/49822 |
| 2020/0266136 A1* | 8/2020 | Lee | H01L 23/49822 |
| 2021/0066120 A1 | 3/2021 | Yang et al. | |

OTHER PUBLICATIONS

IBM "List of IBM Patents or Patent Applications Treated as Related; (Appendix P)", Filed Sep. 15, 2021, 2 pages.

\* cited by examiner

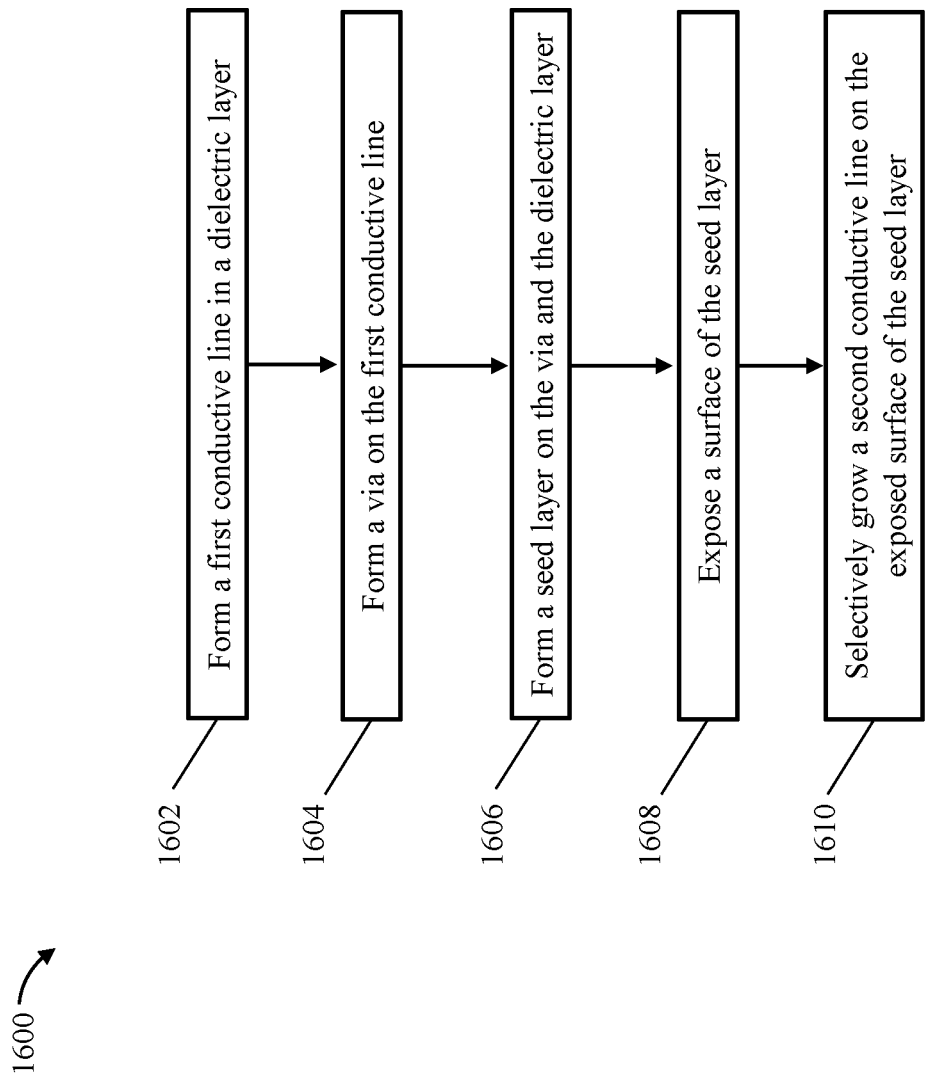

TOP VIA WITH NEXT LEVEL LINE SELECTIVE GROWTH

BACKGROUND

The present invention generally relates to fabrication methods and resulting structures for semiconductor devices, and more specifically, to fabrication methods and resulting semiconductor structures for forming a conductive thin metal layer on a top via that enables a next level selective growth of the interconnect line above the top via.

The fabrication of very large scale integrated (VLSI) or ultra large scale integrated (VLSI) circuits requires the manufacture of sophisticated interconnect structures including metallic wiring that connects individual devices in a semiconductor chip to one another. Typically, the wiring interconnect network includes two types of features that serve as electrical conductors, namely, line features that traverse a distance across the chip, and conductive via features that connect lines in different levels. The conducting metal lines and conductive vias are made of conductive material, such as aluminum or copper, and are electrically insulated by interlayer dielectrics (ILD).

SUMMARY

Embodiments of the invention are directed to a method for forming a conductive thin metal layer on a top via for next level line selective growth. A non-limiting example of the method includes forming a first conductive line in a dielectric layer. A via is formed on the first conductive line and a seed layer is formed on the via and the dielectric layer. A surface of the seed layer is exposed and a second conductive line is deposited onto the exposed surface of the seed layer.

Embodiments of the invention are directed to a method for forming a conductive thin metal layer on a top via for next level line selective growth. A non-limiting example of the method includes forming a first conductive line in a dielectric layer. A via is formed on the first conductive line and a seed layer is formed on the via and the dielectric layer. A surface of the seed layer is exposed and a second conductive line is selectively grown from the exposed surface of the seed layer.

Embodiments of the invention are directed to an integrated circuit. A non-limiting example of the integrated circuit includes a first conductive line in a dielectric layer. The integrated circuit further includes a via on the first conductive line and a seed layer on a surface of the via. The seed layer extends over the dielectric layer. A second conductive line is positioned directly on a surface of the seed layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 16 depicts a flow diagram illustrating a method according to one or more embodiments of the invention.

Figure 1:
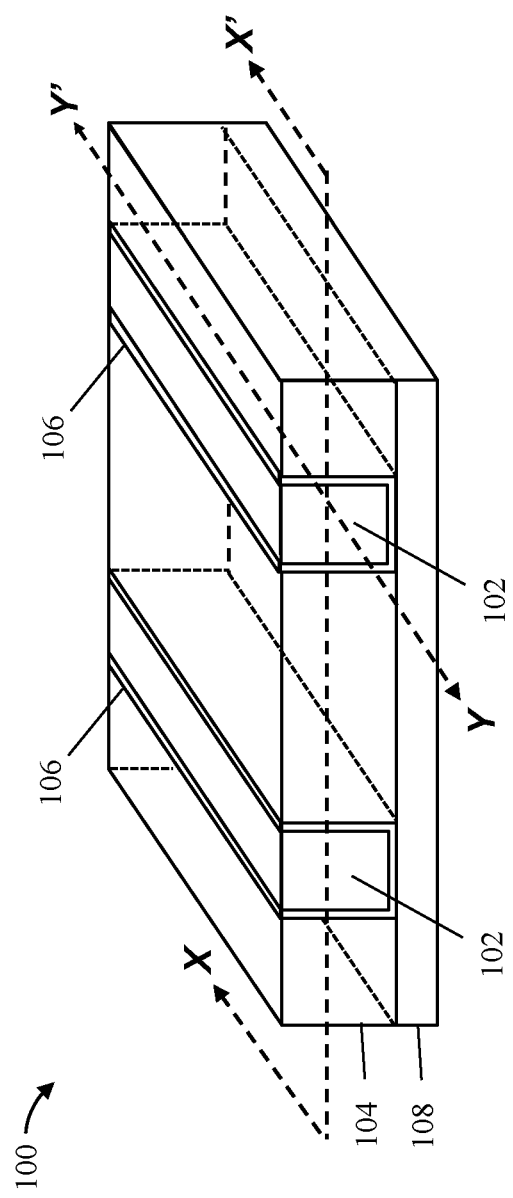
FIG. 1 depicts an isometric view of a semiconductor structure after a processing operation according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. To increase the number of circuits that can be provided on a chip, the semiconductor industry has repeatedly shrunk the transistor gate length and the chip size. As a consequence, the interconnect structure that forms the metallic circuitry has also shrunk. As the integrated circuit (IC) footprint continues to decrease, features (lines, vias, etc.) and spacing tolerances (i.e., feature to feature spacing) also decrease, complicating the manufacturing process.

Fabricating intricate structures of conductive interconnect layers within increasingly smaller wafer footprints is one of the most process-intensive and cost-sensitive portions of semiconductor IC fabrication. Advanced BEOL processes incorporate phase-shifting, optical proximity correction, and other practices to satisfy these scaling demands, and can achieve a line to line pitch below 30 nm. There are challenges, however, in fabricating advanced interconnects having a line to line pitch below 30 nm. For example, the selective growth of interconnect lines and vias is difficult because it requires a thin (e.g., 1 to 5 nm) conductive layer to act as a template to initiate growth. The selective growth of a via is somewhat manageable due to the relatively larger surface area of the line below, which can serve as the thin conductive layer for the via. In the case of a line itself, however, the problem is compounded by the fact that the exposed metallic vias below have a very small exposed metal area (i.e., much smaller than the required line area).

Turning now to an overview of aspects of the present invention, one or more embodiments of the invention address the above-described challenges of the prior art by providing a new semiconductor structure and a method for fabricating top vias that leverages a conductive thin metal layer for next level selective growth. In multilayered interconnect structures described herein, the metallization layers are referred to as "M" layers (e.g., M1 layer, M2 layer, etc.) while "V" layers denote the conductive vias placed between adjacent M layers (e.g., V1 is between the M1 and M2 layers). As used herein, a "top via" refers to a "$V_x$" layer via which is integrally formed from patterning the line below (an "$M_x$" layer) and which electrically couples the line below (an "$M_x$" layer) to a line above (an "$M_{x+1}$" layer).

In some embodiments of the invention, a thin conductive layer (sometimes referred to as a seed layer) is deposited above a via that can later act as a template to initiate the selective growth of metal lines above the via (i.e., next level selective growth). Following the metallization of the metal lines above, the templating dielectric and thin metal layer are removed and replaced with a low-k dielectric. The templating dielectric can be damaged during the line and via patterning steps and replacing the templating dielectric in this manner can improve the capacitance of the final device.

In some embodiments of the invention, the presence of the thin metal layer promotes high-quality (i.e., uniform, defect-free) gap-filling of conductive material (e.g., metal) in the lines above the via. Advantageously, this improved gap-filling enables reductions in barrier liner thicknesses in the conductive line, improving resistance.

In some embodiments of the invention, the presence of the thin metal layer enables the selective growth of metal in the line above the via. Advantageously, the conductive line above the via can be formed using a non-damascene-based process that does not require damascene metallization or metal planarization (e.g., CMP).

Unlike self-aligned metallization techniques in the prior art, this new method enables the selective growth of interconnect lines as opposed to the selective growth of interconnect vias. Moreover, while interconnect lines and vias are typically formed using dual damascene-based processes, the present method enables a top via integration scheme whereby lines (e.g., the line above) are selectively formed using a non-damascene-based process while vias (e.g., a top via) are formed using damascene-based processes.

Turning now to a more detailed description of aspects of the present invention, FIG. 1 depicts an isometric view of an interconnect structure 100 after an initial set of fabrication operations according to one or more embodiments of the invention. In FIG. 1, known fabrication operations have been used to form the interconnect structure 100 such that it includes a conductive line 102 in a dielectric layer 104. In some embodiments of the invention, a liner 106 is positioned between the conductive line 102 and the dielectric layer 104. In some embodiments of the invention, the conductive line 102 (and the liner 106 if present) are formed on an etch stop layer 108. While not shown for ease of discussion, the conductive line 102 can be one of many lines in a metallization layer of the interconnect structure 100. Moreover, it is understood that the processes described herein, although focusing on the conductive line 102 for ease of discussion, can be used to create metal interconnects having stepped top vias in any metallization layer.

In some embodiments of the invention, the conductive line 102 includes a conductive material formed or deposited in a trench in the dielectric layer 104 using known back-end-of-line (BEOL) processes. In some embodiments of the invention, the conductive line 102 is overfilled above a surface of the trench (not shown), forming overburdens that can be removed using, for example, a chemical-mechanical planarization (CMP) process. The conductive line 102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 102 is a copper line (copper interconnect). The conductive line 102 can be formed or deposited using, for example, CVD, PECVD, PVD, sputtering, plating, chemical solution deposition, and electroless plating.

In some embodiments of the invention, the dielectric layer 104 is an interlayer dielectric. The dielectric layer 104 serves as an isolation structure for the lines and vias of the interconnect structure 100. The dielectric layer 104 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3.0), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

In some embodiments of the invention, the liner 106 can be formed between the conductive line 102 and the dielectric layer 104. The liner 106 can serve as a diffusion barrier, preventing the copper (or other metal) from diffusing into, or doping, the surrounding dielectric materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese. In some embodiments of the invention, the liner 106 is a multi-layer liner (e.g., a two-layer liner). In some embodiments of the invention, a first liner layer can act as a diffusion barrier and the second liner layer can act as a wetting layer that improves the gap-filling capabilities of subsequently deposited materials (i.e., the bulk conductor) while also improving electromigration. In some embodiments of the invention, the first liner layer includes TaN or Ta while the second liner layer includes Co or Ru.

In some embodiments of the invention, the dielectric layer 104 is formed over or directly on the etch stop layer 108. The etch stop layer 108 can be made of, for example, silicon oxide, silicon nitride, silicon oxynitride, boron or aluminum nitrides, high-k materials, or any combination of these materials. As used herein, high-k materials are those having a large dielectric constant relative to silicon dioxide, i.e., more than about 3.9. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the etch stop layer 108 can be formed or deposited to a thickness of about 0.5 nm to about 25 nm, for example 10 nm, although other thicknesses are within the contemplated scope of the invention.

Figure 2:
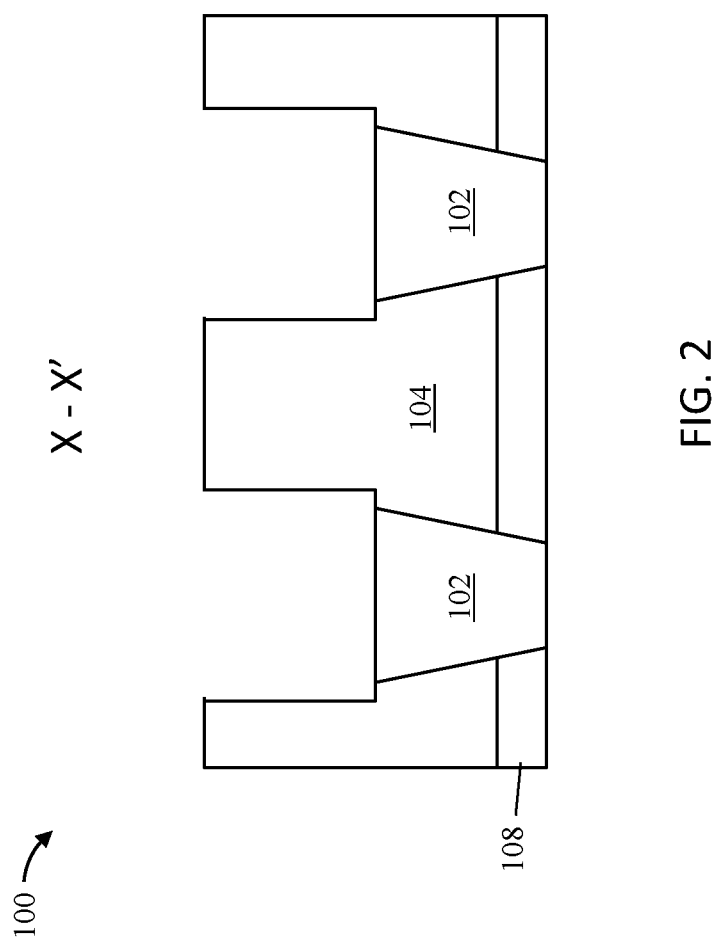
FIG. 2 depicts a cross-sectional view of a semiconductor structure along the line X-X' of FIG. 1 after one or more processing operations according to one or more embodiments of the invention.

FIG. 2 depicts a cross-sectional view of the interconnect structure 100 along the line X-X' of FIG. 1 after a processing operation according to one or more embodiments of the invention. In some embodiments of the invention, the conductive line 102 is recessed. The conductive line 102 can be recessed using a wet etch, a dry etch, or a combination of sequential wet and/or dry etches. In some embodiments of the invention, the conductive line 102 and the liner 106 (when present) are concurrently or sequentially recessed.

In some embodiments of the invention, the conductive line 102 is recessed from the topmost surface of the dielectric layer 104. In some embodiments of the invention, the conductive line 102 is recessed using a wet etchant selective to the dielectric layer 104. In some embodiments of the invention, the conductive line 102 is recessed 1 to 10 nm, although other recess depths are within the contemplated scope of the invention.

Figure 3:
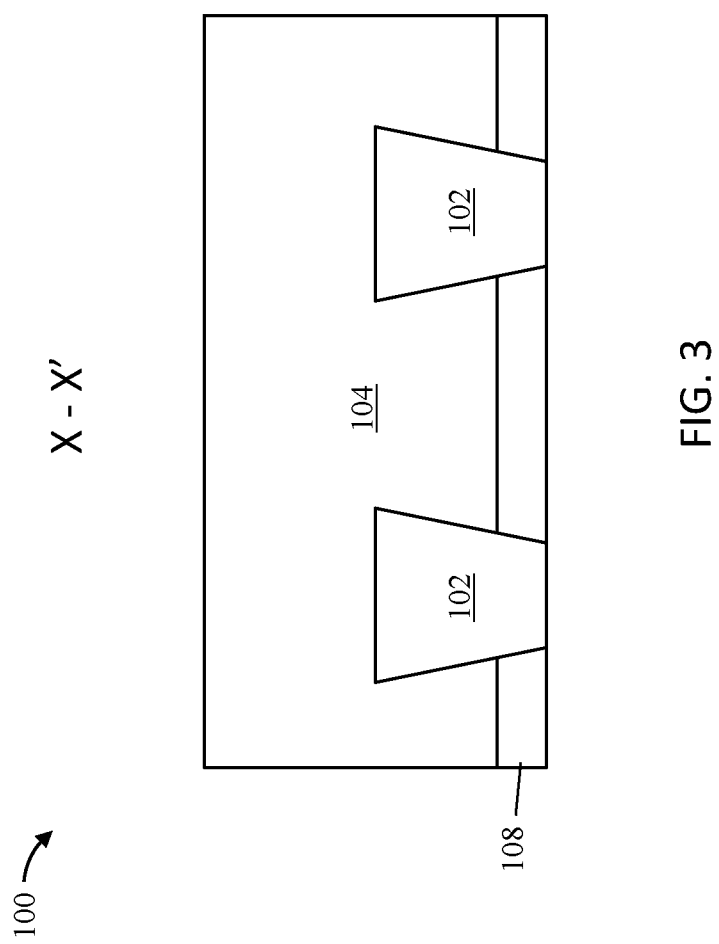
FIG. 3 depicts a cross-sectional view of a semiconductor structure along the line X-X' of FIG. 1 after one or more processing operations according to one or more embodiments of the invention.

FIG. 3 depicts a cross-sectional view of the interconnect structure 100 along the line X-X' of FIG. 1 after a processing operation according to one or more embodiments of the invention. In some embodiments of the invention, additional dielectric material is deposited or formed on the recessed surface of the conductive line 102. In some embodiments of the invention, the additional dielectric material is bulk deposited over the interconnect structure 100, forming an overburden on the conductive line 102. The additional dielectric material can be formed or deposited using, for example, CVD, PECVD, ALD, flowable CVD, spin-on dielectrics, or PVD. The additional dielectric material can be deposited to any suitable thickness. In some embodiments of the invention, the additional dielectric material is deposited to a height of about 50 nm above the recessed surface of the conductive line 102, although other heights are within the contemplated scope of the invention.

The additional dielectric material can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. In some embodiments of the invention, the additional dielectric material is the same material as the dielectric layer 104, forming a continuous dielectric region (as shown in FIG. 3).

Figure 4:
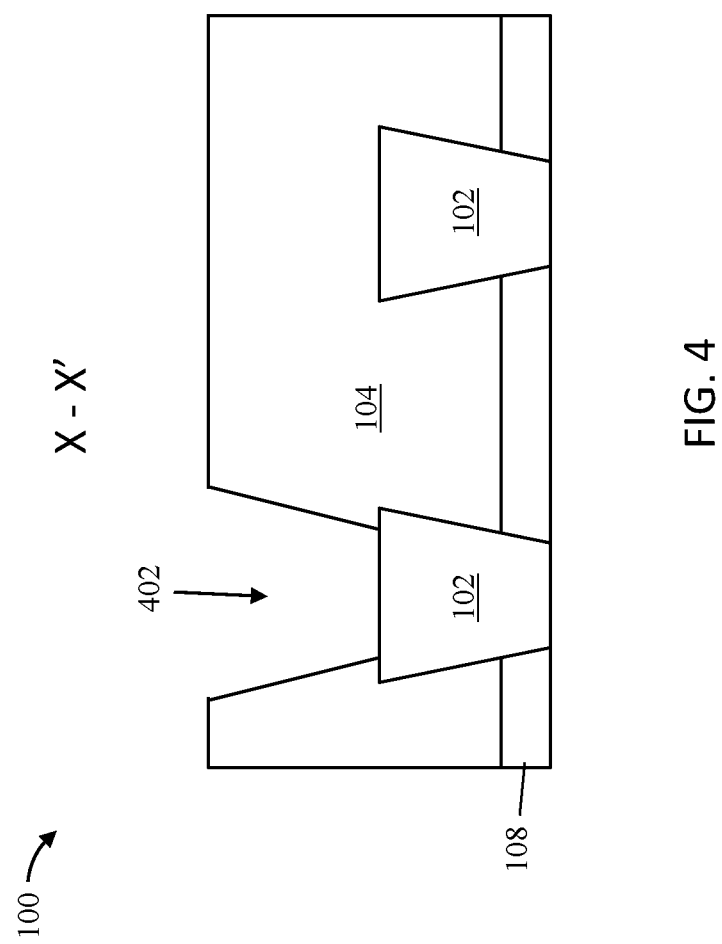
FIG. 4 depicts a cross-sectional view of a semiconductor structure along the line X-X' of FIG. 1 after one or more processing operations according to one or more embodiments of the invention.

FIG. 4 depicts a cross-sectional view of the interconnect structure 100 along the line X-X' of FIG. 1 after a processing operation according to one or more embodiments of the invention. In some embodiments of the invention, portions of the dielectric layer 104 are removed (patterned) to form a via recess 402 that exposes a surface of the conductive line 102. The dielectric layer 104 can be patterned using a wet etch, a dry etch, or a combination of sequential wet and/or dry etches. In some embodiments of the invention, the dielectric layer 104 is removed selective to the conductive line 102. For example, dielectric material can be removed selective to a metal using reactive ion etching (ME).

Figure 5:
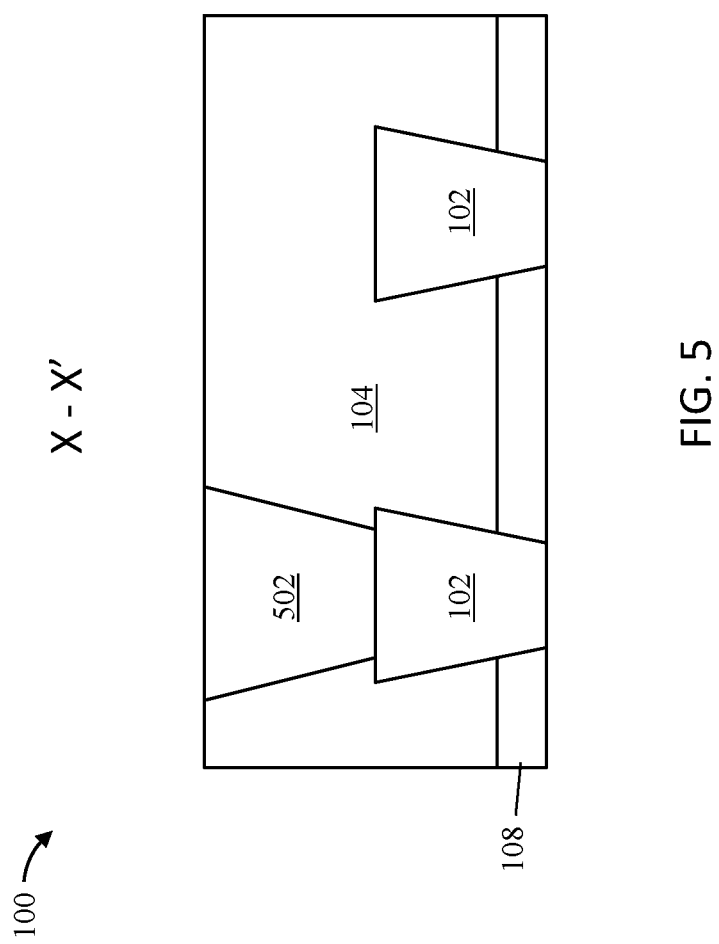
FIG. 5 depicts a cross-sectional view of a semiconductor structure along the line X-X' of FIG. 1 after one or more processing operations according to one or more embodiments of the invention.

FIG. 5 depicts a cross-sectional view of the interconnect structure 100 along the line X-X' of FIG. 1 after a processing operation according to one or more embodiments of the invention. In some embodiments of the invention, a via 502 is formed in the via recess 402.

In some embodiments of the invention, the via 502 can be formed from materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the via 502 is formed from a same material as the conductive line 102. For example, the via 502 and the conductive line 102 can be made cobalt or ruthenium. In some embodiments of the invention, the via 502 and the conductive line 102 are made of different conductive materials. For example, the via 502 can be made cobalt or ruthenium and the conductive line 102 can be made of copper.

Figure 6:
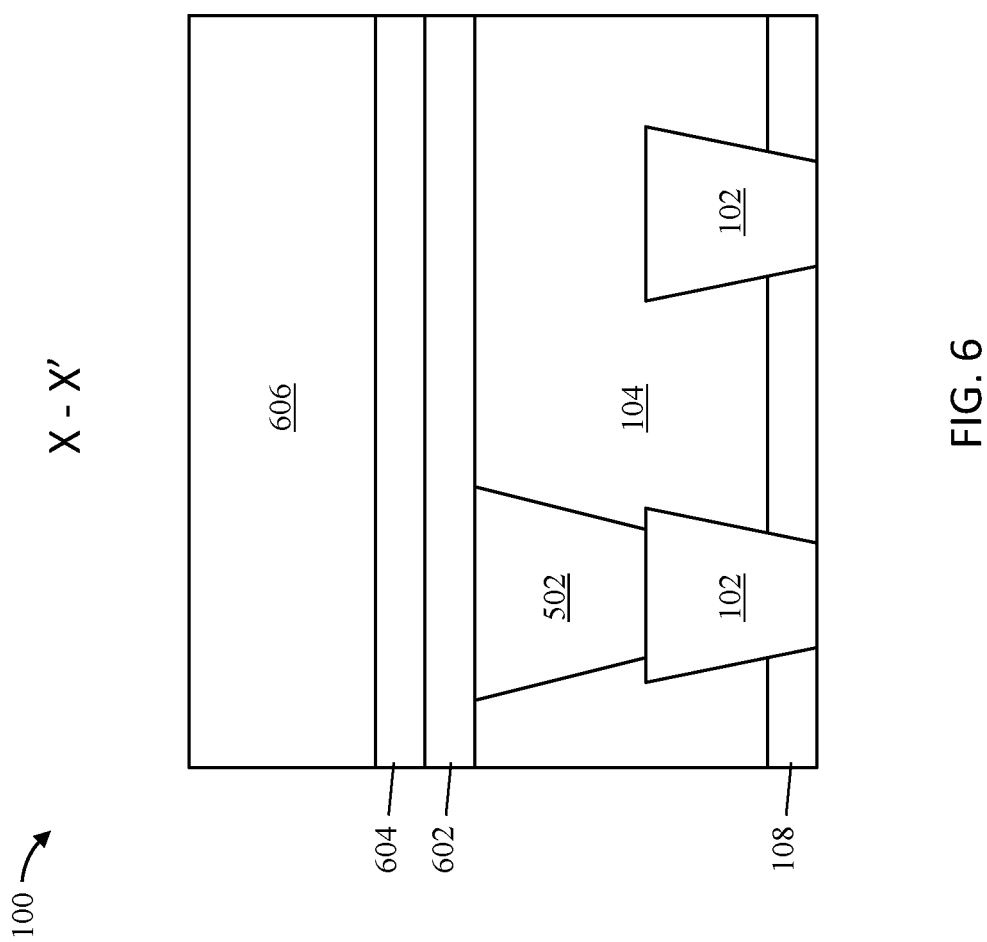
FIG. 6 depicts a cross-sectional view of a semiconductor structure along the line X-X' of FIG. 1 after one or more processing operations according to one or more embodiments of the invention.

FIG. 6 depicts a cross-sectional view of the interconnect structure 100 along the line X-X' of FIG. 1 after a processing operation according to one or more embodiments of the invention. In some embodiments of the invention, a seed layer 602 is formed on the dielectric layer 104 and the via 502. In some embodiments of the invention, the seed layer 602 is a thin conductive layer (e.g., a thin metal layer) having a thickness of about 1 to 5 nm, although other thicknesses are within the contemplated scope of the invention.

In some embodiments of the invention, the seed layer 602 can be formed from materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the seed layer 602 is made of a same conductive material as the via 502. In some embodiments of the invention, the seed layer 602 is made of a different conductive material than the via 502.

In some embodiments of the invention, an etch stop layer 604 is formed on the seed layer 602. The etch stop layer 604 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the etch stop layer 602 can be formed or deposited to a thickness of about 0.5 nm to about 25 nm, for example 10 nm, although other thicknesses are within the contemplated scope of the invention.

As further shown in FIG. 6, in some embodiments of the invention, a dielectric layer 606 can be formed on the etch stop layer 604. In some embodiments of the invention, the dielectric layer 606 is an interlayer dielectric. The dielectric layer 606 serves as an isolation structure for the lines and vias of the interconnect structure 100. The dielectric layer 606 can be made of any suitable dielectric material, such as, for example, low-k dielectrics, ultra-low-k dielectrics, porous silicates, carbon doped oxides, silicon dioxides, silicon nitrides, silicon oxynitrides, silicon carbide (SiC), or other dielectric materials. Any known manner of forming the dielectric layer 606 can be utilized, such as, for example, CVD, PECVD, ALD, flowable CVD, spin-on dielectrics, or PVD.

Figure 7:
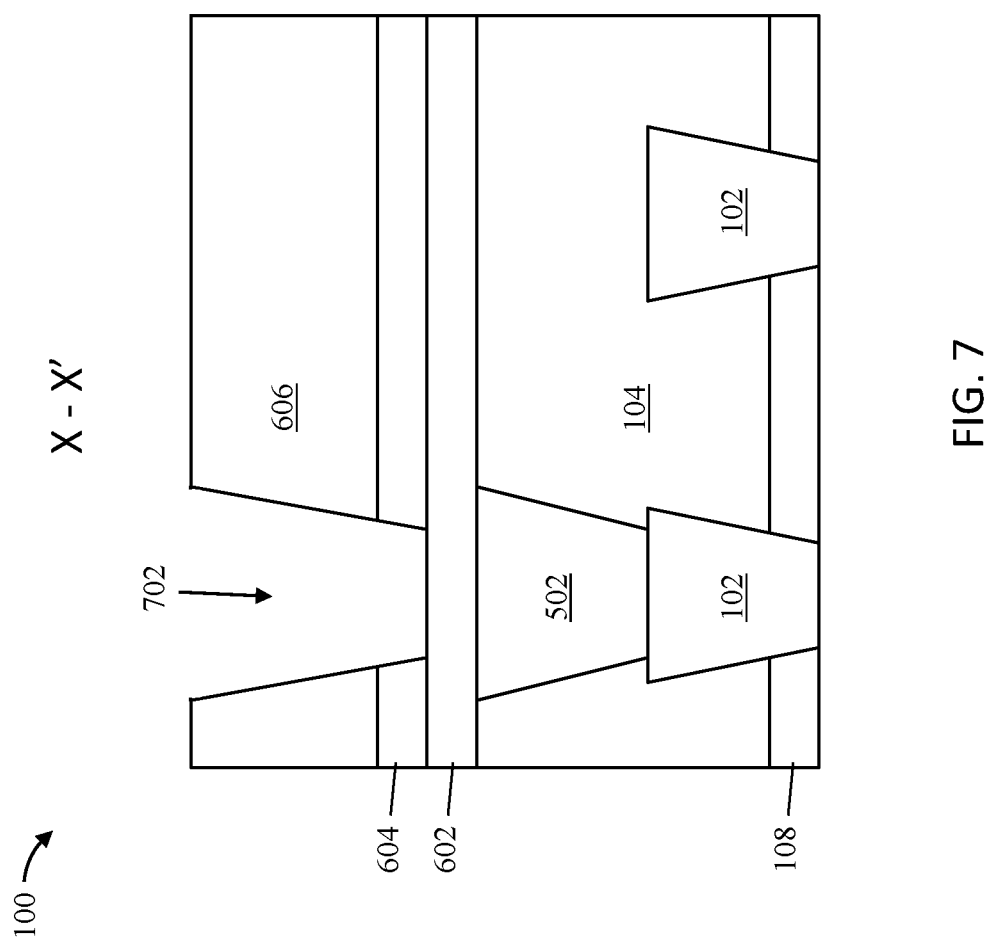
FIG. 7 depicts a cross-sectional view of a semiconductor structure along the line X-X' of FIG. 1 after one or more processing operations according to one or more embodiments of the invention.

FIG. 7 depicts a cross-sectional view of the interconnect structure 100 along the line X-X' of FIG. 1 after a processing operation according to one or more embodiments of the invention. In some embodiments of the invention, portions of the dielectric layer 606 and portions of the etch stop layer 604 are removed (patterned) to form a line trench 702 that exposes a surface of the seed layer 602. The dielectric layer 606 and the etch stop layer 604 can be patterned using a wet etch, a dry etch, or a combination of sequential wet and/or dry etches. In some embodiments of the invention, the dielectric layer 606 is removed selective to the etch stop layer 604 and the exposed portion of the etch stop layer 604 is removed to expose the surface of the seed layer 602.

Figure 8:
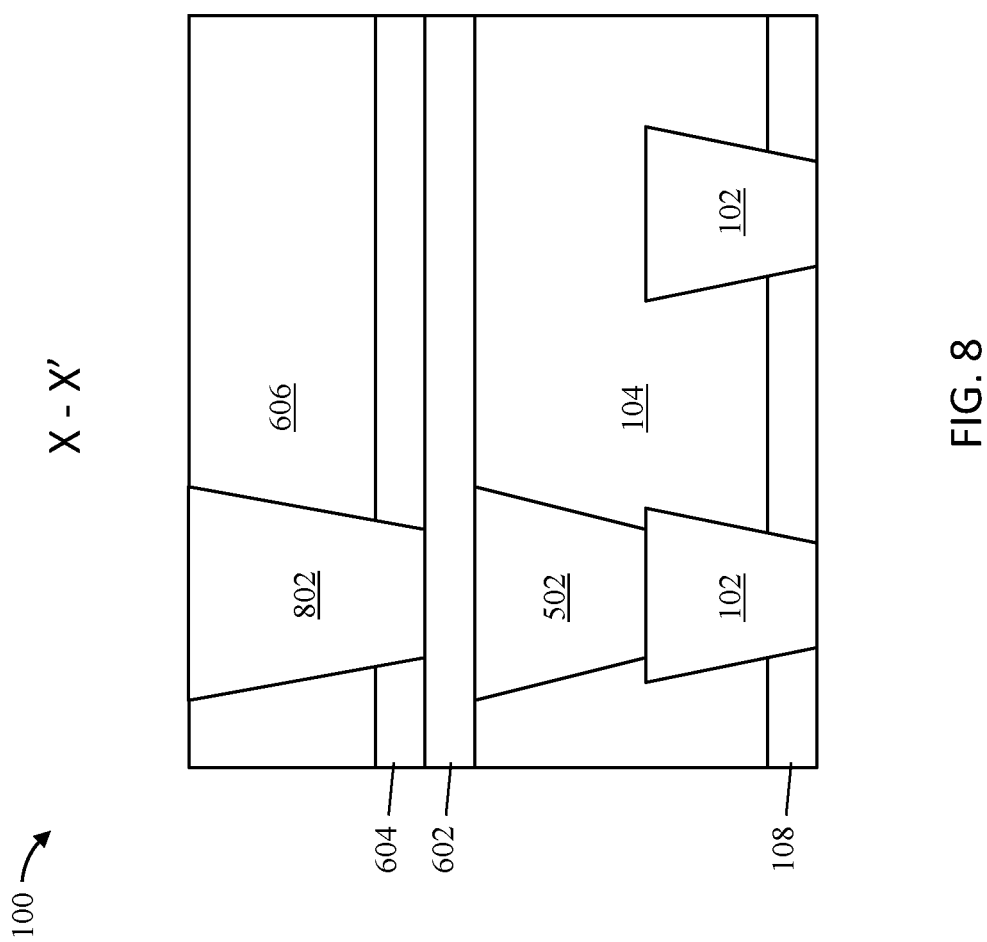
FIG. 8 depicts a cross-sectional view of a semiconductor structure along the line Y-Y' of FIG. 1 after one or more processing operations according to one or more embodiments of the invention.

FIG. 8 depicts a cross-sectional view of the interconnect structure 100 along the line X-X' of FIG. 1 after a processing operation according to one or more embodiments of the invention. In some embodiments of the invention, a conductive line 802 is formed in the line trench 702.

In some embodiments of the invention, the conductive line 802 includes a conductive material formed or deposited in the line trench 702 on a surface of the seed layer 602. In some embodiments of the invention, the conductive line 802 is overfilled above a surface of the line trench 702, forming overburdens that can be removed using, for example, a chemical-mechanical planarization (CMP) process. The conductive line 802 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 802 is a copper line (copper interconnect). The conductive line 802 can be formed or deposited using, for example, CVD, PECVD, PVD, sputtering, plating, chemical solution deposition, and electroless plating.

As discussed previously herein, the presence of the seed layer 602 at the bottom of the line trench 702 promotes high-quality gap-filling of the material for the conductive line 802. In some embodiments of the invention, this enables reducing any barrier/liner thicknesses in the conductive line 802, improving the interconnect resistance in the final device.

Figure 9:
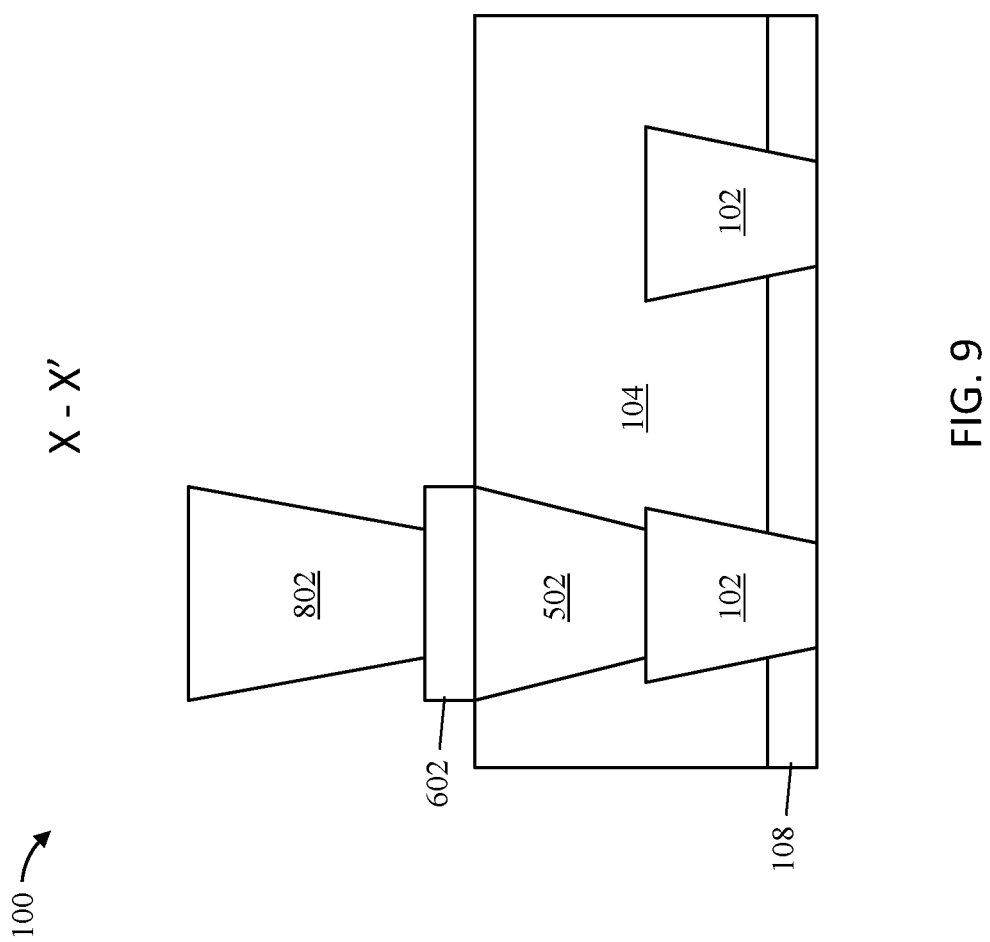
FIG. 9 depicts a cross-sectional view of a semiconductor structure along the line Y-Y' of FIG. 1 after one or more processing operations according to one or more embodiments of the invention.

FIG. 9 depicts a cross-sectional view of the interconnect structure 100 along the line X-X' of FIG. 1 after a processing operation according to one or more embodiments of the invention. In some embodiments of the invention, the dielectric layer 606 and the etch stop layer 604 are removed to expose a surface of the seed layer 602. In some embodiments of the invention, the dielectric layer 606 and the etch stop layer 604 are removed using a wet etch, a dry etch, or a combination of sequential wet and/or dry etches. In some embodiments of the invention, the dielectric layer 606 is removed selective to the etch stop layer 604 and/or the conductive line 802. In some embodiments of the invention, the etch stop layer 604 is removed selective to the seed layer 602 and/or the conductive line 802.

As discussed previously herein, forming the line trench 702 can result in damage to the dielectric layer 606. For example, in some embodiments of the invention, exposed sidewalls of the dielectric layer are damaged to a depth of 1 to 2 nm from the interface with the line trench 702, although other damage depths are within the contemplated scope of the invention. Advantageously, removing the dielectric layer 606 removes any damage to the dielectric material. The dielectric material is later replaced with damage-free dielectrics (as shown in FIG. 10).

In some embodiments of the invention, exposed portions of the seed layer 602 (i.e., those portions not covered by the conductive line 802) are removed (patterned) to expose a surface of the dielectric layer 104. In some embodiments of the invention, the seed layer 602 is removed using a wet etch, a dry etch, or a combination of sequential wet and/or dry etches. In this manner, the patterned seed layer 602 is confined to the region directly adjacent to (under) the conductive line 802.

Figure 10:
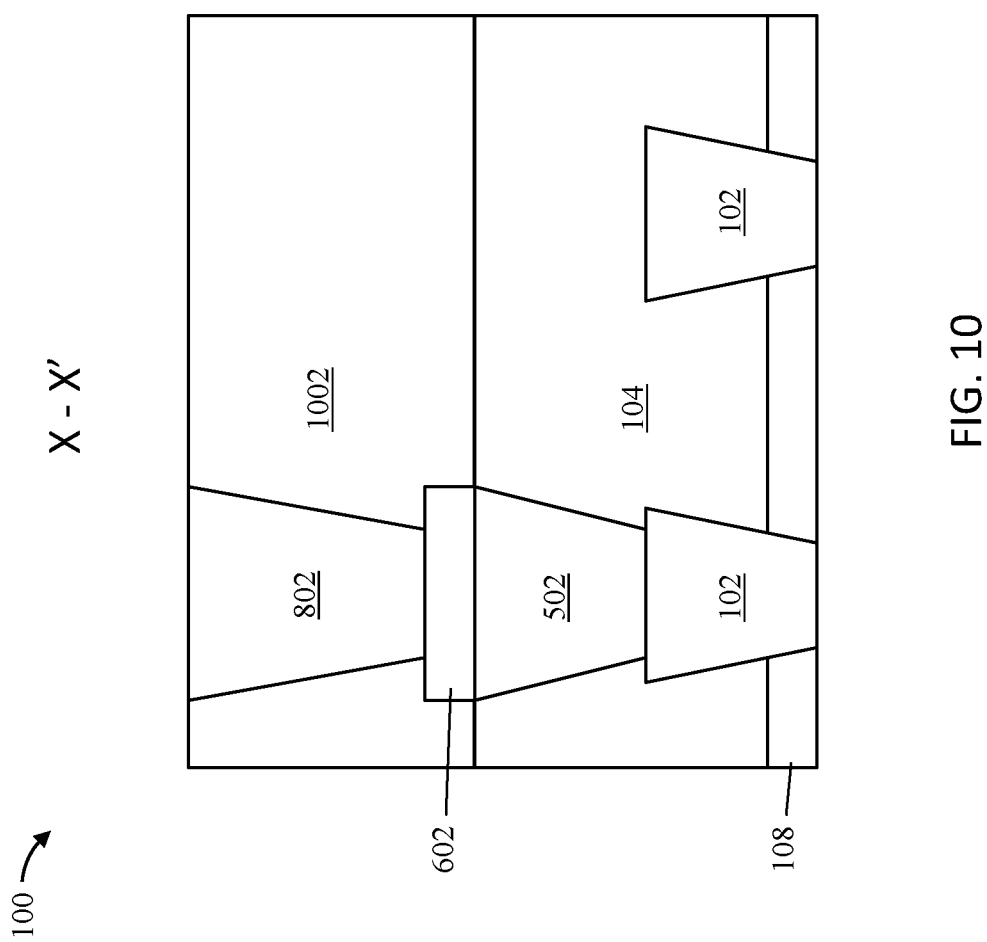
FIG. 10 depicts a cross-sectional view of a semiconductor structure along the line Y-Y' of FIG. 1 after one or more processing operations according to one or more embodiments of the invention.

FIG. 10 depicts a cross-sectional view of the interconnect structure 100 along the line X-X' of FIG. 1 after a processing operation according to one or more embodiments of the invention. In some embodiments of the invention, a dielectric layer 1002 is deposited or formed on the dielectric layer 104. As discussed previously herein, forming the line trench 702 can result in damage to the dielectric layer 606. Advantageously, the dielectric layer 1002 serves to replace the dielectric layer 606. As the dielectric layer 1002 is formed after the conductive line 802, no etch-induced damaged layer remains in the vicinity of the conductive line 802.

In some embodiments of the invention, the dielectric layer 1002 is bulk deposited over the interconnect structure 100, forming an overburden on the conductive line 802. The additional dielectric material can be formed or deposited using, for example, CVD, PECVD, ALD, flowable CVD, spin-on dielectrics, or PVD. The additional dielectric material can be deposited to any suitable thickness. In some embodiments of the invention, the additional dielectric material is deposited to a height of about 50 nm above the surface of the conductive line 802, although other heights are within the contemplated scope of the invention.

The dielectric layer 1002 can be made of any suitable dielectric material, such as, for example, low-k dielectrics, ultra-low-k dielectrics, porous silicates, carbon doped oxides, silicon dioxides, silicon nitrides, silicon oxynitrides, silicon carbide (SiC), or other dielectric materials. In some embodiments of the invention, the dielectric layer 1002 is the same material as the dielectric layer 104, forming a continuous dielectric region (not shown).

Figure 11:
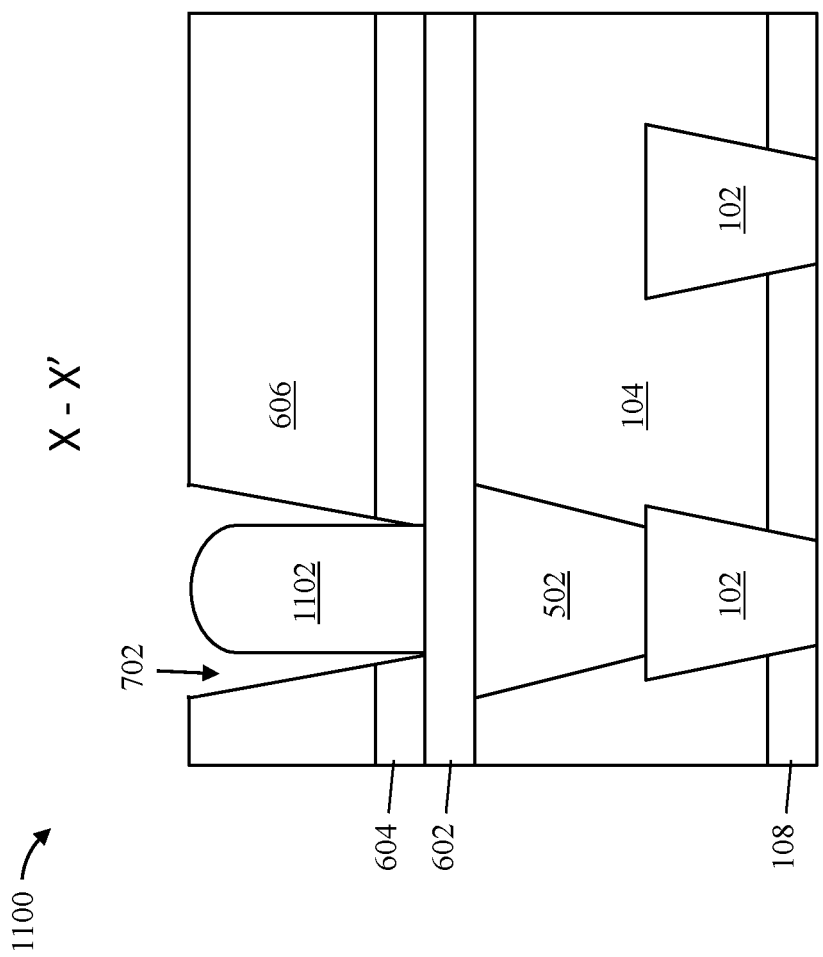
FIG. 11 depicts a cross-sectional view of a semiconductor structure along the line Y-Y' of FIG. 1 after one or more processing operations according to one or more embodiments of the invention.

FIG. 11 depicts a cross-sectional view of an interconnect structure 1100 along the line X-X' of FIG. 7 after a processing operation according to one or more embodiments of the invention. In some embodiments of the invention, a conductive line 1102 is formed in the line trench 702.

In some embodiments of the invention, the conductive line 1102 includes a conductive material formed or deposited in the line trench 702 on a surface of the seed layer 602. The conductive line 1102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 1102 is a cobalt or ruthenium line.

In contrast to the conductive line 802 discussed with respect to FIG. 8 (which is bulk deposited using high-quality gap-filling followed by CMP), the conductive line 1102 is selectively grown from the surface of the seed layer 602 in the line trench 702. In other words, the conductive line 1102 can be self-aligned to the seed layer 602. In some embodiments of the invention, the resulting structure of the selective growth is a domed line centered in the line trench 702. The conductive line 1102 can be selectively formed using, for example, CVD, PECVD, PVD, sputtering, plating, chemical solution deposition, and electroless plating.

As discussed previously herein, the presence of the seed layer 602 at the bottom of the line trench 702 enables the selective growth of the conductive line 1102 above the via 502. Advantageously, the conductive line 1102 above the via 502 can be formed using a non-damascene-based process that does not require damascene metallization or metal planarization (e.g., CMP).

Figure 12:
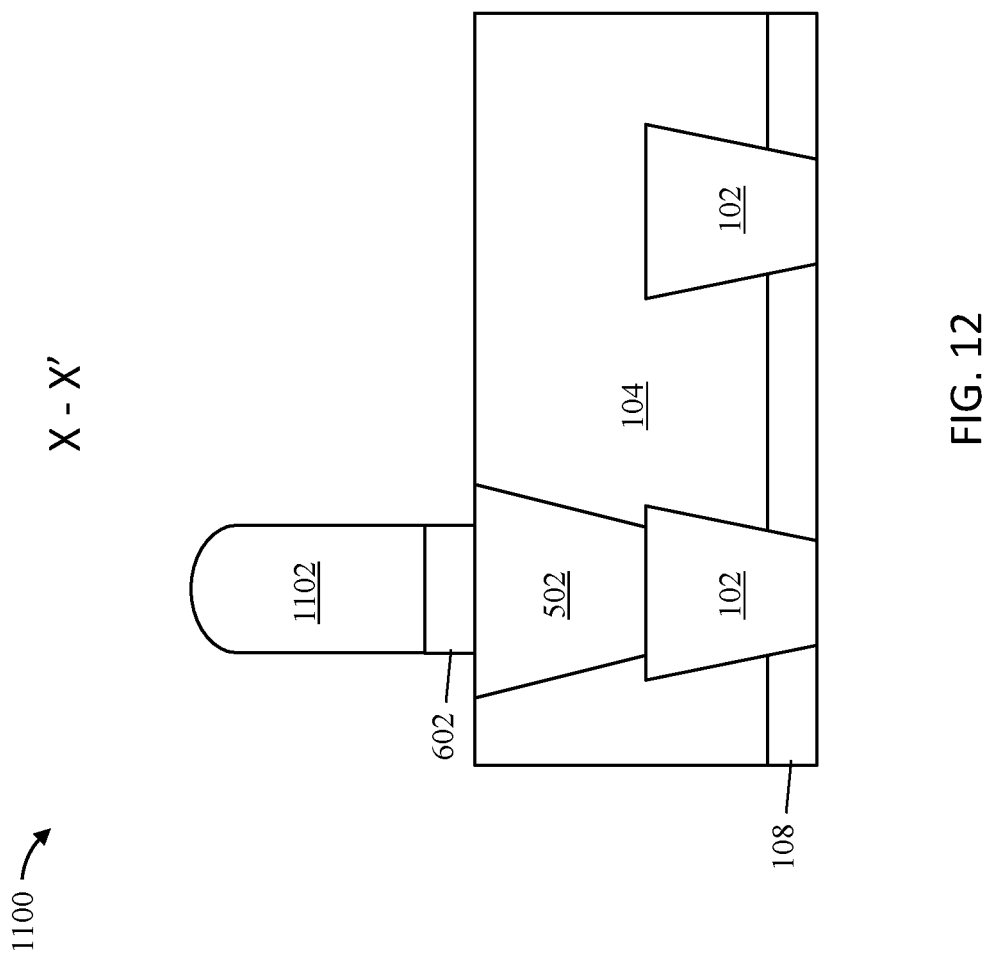
FIG. 12 depicts a cross-sectional view of a semiconductor structure along the line Y-Y' of FIG. 1 after one or more processing operations according to one or more embodiments of the invention.

FIG. 12 depicts a cross-sectional view of the interconnect structure 1100 along the line X-X' of FIG. 1 after a processing operation according to one or more embodiments of the invention. In some embodiments of the invention, the dielectric layer 606 and the etch stop layer 604 are removed to expose a surface of the seed layer 602. In some embodiments of the invention, the dielectric layer 606 and the etch stop layer 604 are removed using a wet etch, a dry etch, or a combination of sequential wet and/or dry etches. In some embodiments of the invention, the dielectric layer 606 is removed selective to the etch stop layer 604 and/or the conductive line 1102. In some embodiments of the invention, the etch stop layer 604 is removed selective to the seed layer 602 and/or the conductive line 1102.

As discussed previously herein, forming the line trench 702 can result in damage to the dielectric layer 606 and removing the dielectric layer 606 also serves to remove any dielectric damage. The dielectric material is later replaced with damage-free dielectrics (as shown in FIG. 13).

In some embodiments of the invention, exposed portions of the seed layer 602 (i.e., those portions not covered by the conductive line 1102) are removed (patterned) to expose a surface of the dielectric layer 104. In some embodiments of the invention, the seed layer 602 is removed using a wet etch, a dry etch, or a combination of sequential wet and/or dry etches. In some embodiments of the invention, portions of the seed layer 602 are removed selective to the conductive line 1102. In this manner, the patterned seed layer 602 is confined to the region directly adjacent to (under) the conductive line 1102. In other words, all of the sidewalls of the seed layer 602 can be coplanar to the corresponding sidewalls of the conductive line 1102.

Figure 13:
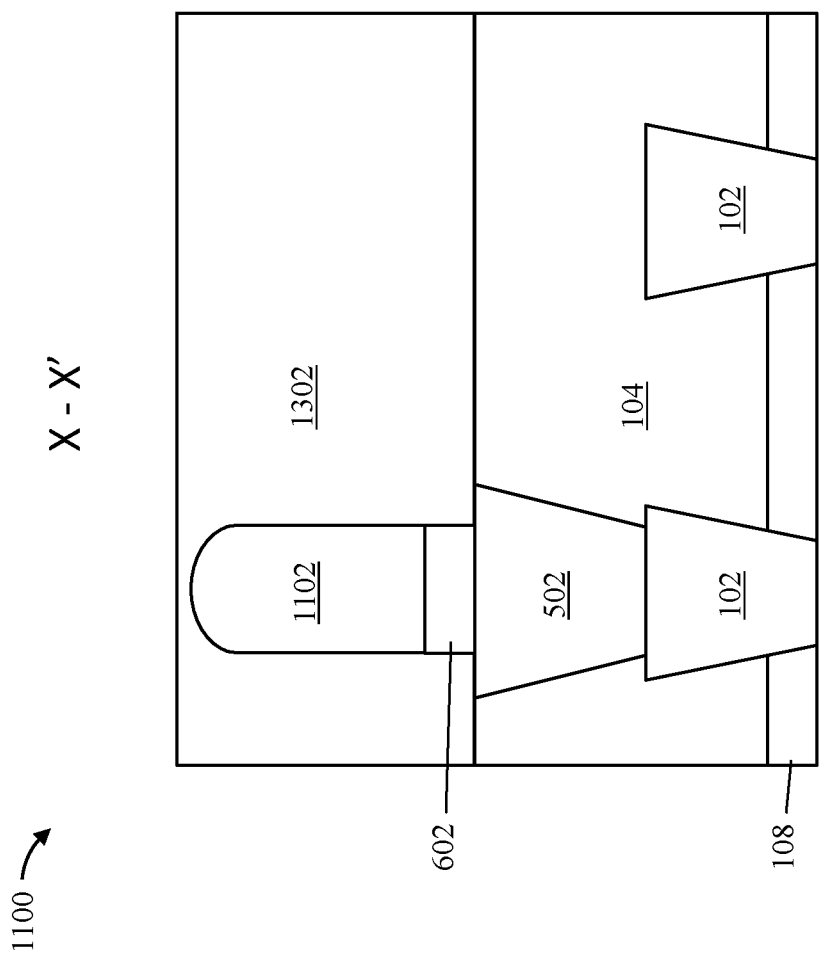
FIG. 13 depicts a cross-sectional view of a semiconductor structure along the line Y-Y' of FIG. 1 after one or more processing operations according to one or more embodiments of the invention.

FIG. 13 depicts a cross-sectional view of the interconnect structure 100 along the line X-X' of FIG. 1 after a processing operation according to one or more embodiments of the invention. In some embodiments of the invention, a dielectric layer 1302 is deposited or formed on the dielectric layer 104. In some embodiments of the invention, the dielectric layer 1302 is bulk deposited over the interconnect structure 1100, forming an overburden on the conductive line 1102. The additional dielectric material can be formed or deposited using, for example, CVD, PECVD, ALD, flowable CVD, spin-on dielectrics, or PVD. The additional dielectric material can be deposited to any suitable thickness. In some embodiments of the invention, the additional dielectric material is deposited to a height of about 50 nm above the surface of the conductive line 1102, although other heights are within the contemplated scope of the invention.

The dielectric layer 1302 can be made of any suitable dielectric material, such as, for example, low-k dielectrics, ultra-low-k dielectrics, porous silicates, carbon doped oxides, silicon dioxides, silicon nitrides, silicon oxynitrides, silicon carbide (SiC), or other dielectric materials. In some embodiments of the invention, the dielectric layer 1302 is the same material as the dielectric layer 104, forming a continuous dielectric region (not shown).

After forming the dielectric layer 1302, the process flow can continue using known BEOL fabrication techniques. For example, while only two "M" layers (e.g., the conductive line 102 and the conductive line 1102) and a single "V" layer (e.g., the via 502) of the interconnect structure 1100 are shown for ease of illustration, it is understood that the interconnect structure 1100 can include any number of "M" layers and any number of "V" layers. Each of these "M" layers above can be selectively formed from a via below in a similar manner as the conductive line 1102.

In other words, after forming the dielectric layer 1302, one or more additional "M" layers alternating with one or more additional "V" layers can be formed over the interconnect structure 1100 using conventional BEOL processes. For example, if the conductive line 102 defines a first "M" layer (i.e., an M1 layer), the conductive line 1102 defines a second "M" layer (i.e., an M2 layer), and the via 502 defines a first "V" layer (i.e., a V1 layer), a second via (i.e., a V2 layer) can be formed over the conductive line 1102. Similarly, a third "M" layer (i.e., an M3 layer) can be formed over the second via. In this manner, any number of alternating "M" layers and "V" layers can be formed over a substrate. In some embodiments of the invention, each of the "M" layers are electrically coupled to other "M" layers (below or above) through one or more of the "V" layer vias (which can include conventional lines as well as conductive lines selectively formed on a seed layer according to one or more embodiments of the present invention).

Figure 14:
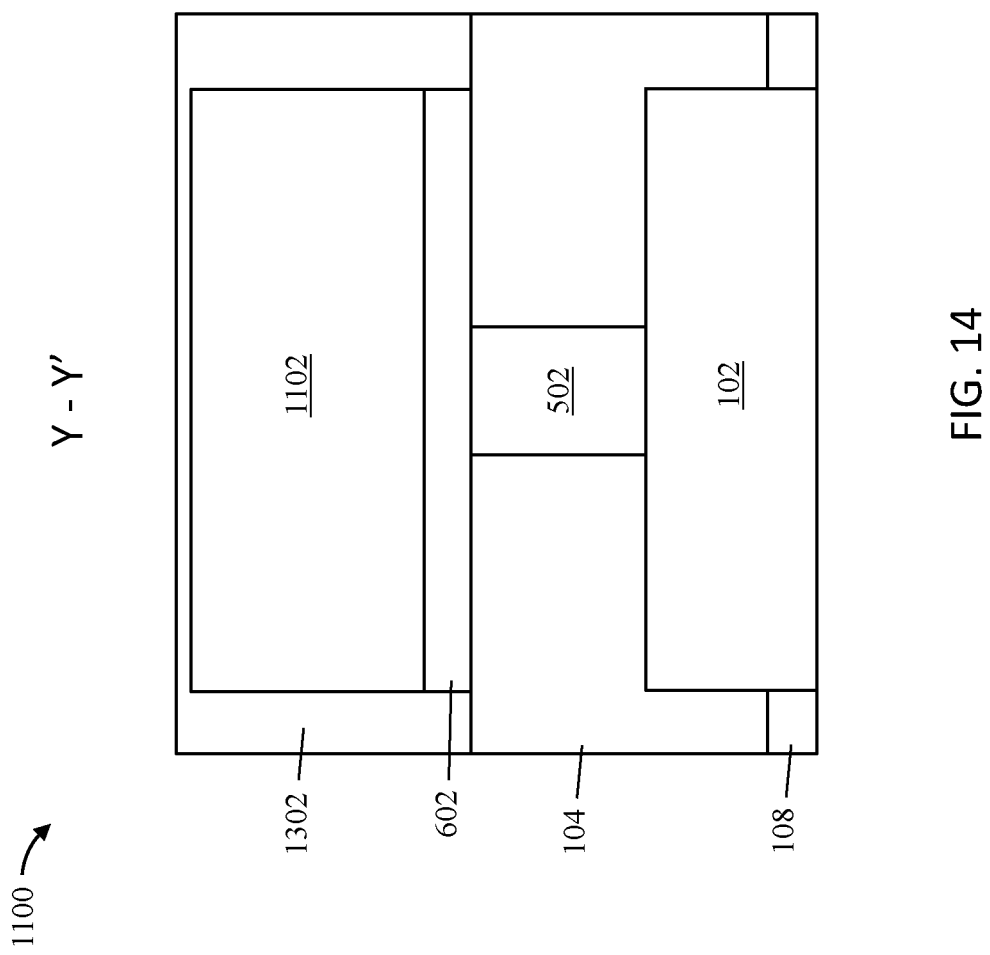
FIG. 14 depicts a cross-sectional view of a semiconductor structure along the line Y-Y' of FIG. 1 after one or more processing operations according to one or more embodiments of the invention.

FIG. 14 depicts a cross-sectional view of the interconnect structure 1100 along the line Y-Y' of FIG. 1 after forming the dielectric layer 1302 as shown in FIG. 13. From this view it is clear that the seed layer 602 extends over the surface of the dielectric layer 104 beyond the sidewalls of the via 502. In this manner the seed layer 602 offers a far larger surface area (relative to the via 502 taken alone) from which the conductive line 1102 can be selectively formed according to one or more embodiments.

Figure 15:
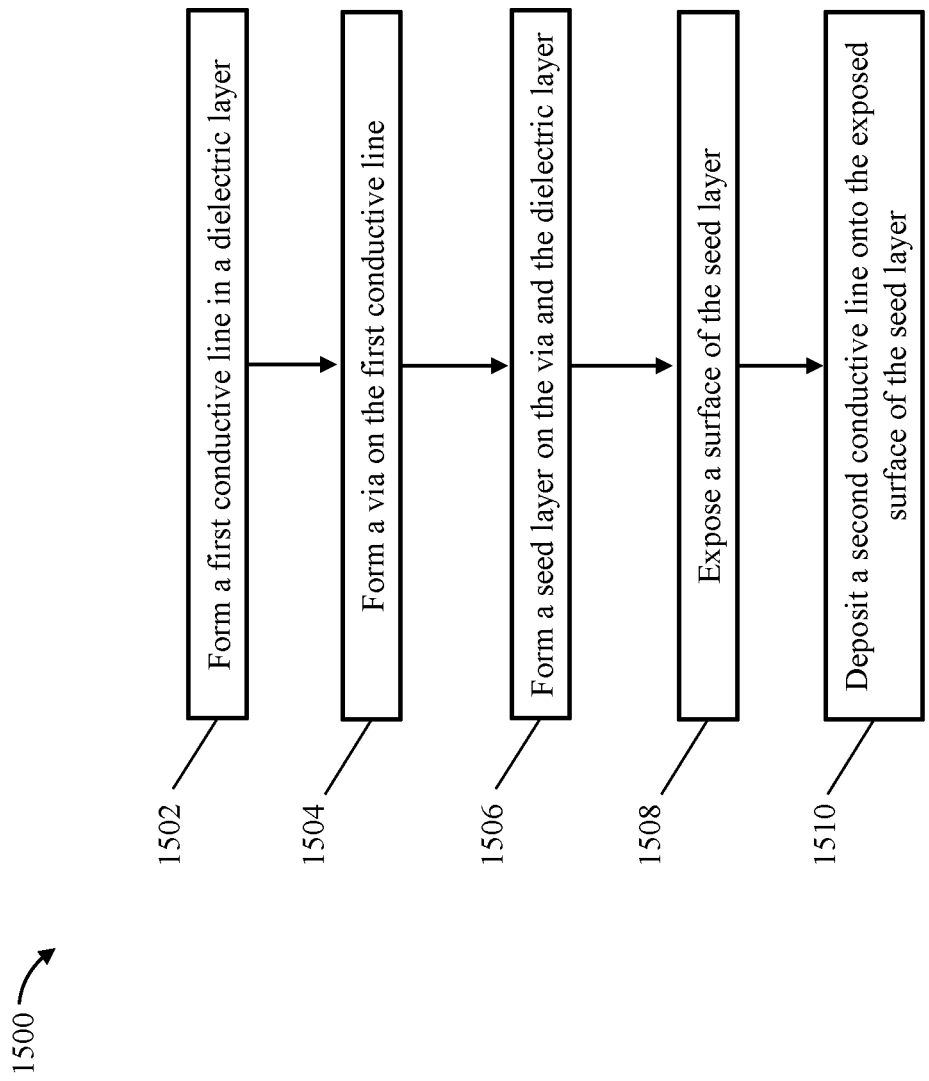
FIG. 15 depicts a flow diagram illustrating a method according to one or more embodiments of the invention.

FIG. 15 depicts a flow diagram 1500 illustrating a method for forming an interconnect structure of an integrated circuit according to one or more embodiments of the invention. As shown at block 1502, a conductive line is formed in a dielectric layer.

At block 1504, a via is formed on the first conductive line. In some embodiments of the invention, the via is a top via. In some embodiments of the invention, forming the top via includes recessing the first conductive line and forming the top via on the recessed surface of the first conductive line.

At block 1506, a seed layer is formed on the via and the dielectric layer. In some embodiments of the invention, the seed layer includes a metal selected to promote high-quality gap-filling of a conductive material of the second conductive line.

At block 1508, a surface of the seed layer is exposed. At block 1510, a second conductive line is deposited onto the exposed surface of the seed layer. In some embodiments of the invention, the conductive line is bulk deposited and any overburden is removed using, for example, CMP (as shown with respect to FIG. 8).

The method can include forming an etch stop layer on the seed layer. A second dielectric layer can be formed on the etch stop layer. In some embodiments of the invention, exposing the surface of the seed layer includes removing portions of the second dielectric layer and portions of the etch stop layer. In some embodiments of the invention, the second dielectric layer, the etch stop layer, and portions of the seed layer are removed to expose a surface of the dielectric layer. In some embodiments of the invention, a portion of the seed layer remains between the via and the second conductive line.

FIG. 16 depicts a flow diagram 1600 illustrating a method for forming an interconnect structure of an integrated circuit according to one or more embodiments of the invention. As shown at block 1602, a conductive line is formed in a dielectric layer.

At block 1604, a via is formed on the first conductive line. In some embodiments of the invention, the via is a top via. In some embodiments of the invention, forming the top via includes recessing the first conductive line and forming the top via on the recessed surface of the first conductive line.

At block 1606, a seed layer is formed on the via and the dielectric layer. In some embodiments of the invention, the seed layer includes a metal or conductive material selected to promote the selective growth of a conductive material of a conductive line above the via (block 1610).

At block 1608, a surface of the seed layer is exposed. At block 1610, a second conductive line is selectively grown from the exposed surface of the seed layer (as shown with respect to FIG. 11). In some embodiments of the invention, a conductive line formed in this manner includes a domed shape (i.e., a domed conductive line).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit comprising:
   a first conductive line in a dielectric layer;
   a via on a topmost surface of the first conductive line;
   a seed layer on a topmost surface of the via, the seed layer extending over a topmost surface of the dielectric layer in a first direction, an entirety of the seed layer recessed from an edge of the via in a second direction perpendicular to the first direction; and
   a second conductive line directly on a topmost surface of the seed layer.

2. The integrated circuit of claim 1, wherein sidewalls of the seed layer are coplanar to sidewalls of the second conductive line.

3. The integrated circuit of claim 2, wherein the second conductive line is self-aligned to the seed layer.

4. The integrated circuit of claim 1, wherein the second conductive line comprises a domed line.

5. An integrated circuit comprising:
   a first conductive line in a dielectric layer;
   a via on a topmost surface of the first conductive line;
   a seed layer on a topmost surface of the via, the seed layer extending over the via and a topmost surface of the dielectric layer in a first direction, wherein an entirety of the seed layer is recessed from an edge of the via to expose the topmost surface of the via in a second direction perpendicular to the first direction; and
   a second conductive line directly on a topmost surface of the seed layer, wherein the second conductive line is self-aligned to the seed layer.

6. The integrated circuit of claim 5, wherein sidewalls of the seed layer are coplanar to sidewalls of the second conductive line.

7. The integrated circuit of claim 5, wherein the second conductive line is selectively grown from a surface of the seed layer.

8. The integrated circuit of claim 7, wherein the second conductive line comprises a domed line centered on the seed layer.

9. The integrated circuit of claim 7, wherein the second conductive line is formed using a non-damascene-based process that does not require damascene metallization or metal planarization.

\* \* \* \* \*